(12) United States Patent
Fukushima et al.

(10) Patent No.: US 9,936,594 B2
(45) Date of Patent: Apr. 3, 2018

(54) WIRING MODULE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Naoki Fukushima, Mie (JP); Mitsutoshi Morita, Mie (JP); Osamu Nakayama, Mie (JP); Tetsuya Fujita, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 48 days.

(21) Appl. No.: 15/302,766

(22) PCT Filed: Apr. 1, 2015

(86) PCT No.: PCT/JP2015/060348
§ 371 (c)(1),
(2) Date: Oct. 7, 2016

(87) PCT Pub. No.: WO2015/156188
PCT Pub. Date: Oct. 15, 2015

(65) Prior Publication Data
US 2017/0034938 A1    Feb. 2, 2017

(30) Foreign Application Priority Data
Apr. 11, 2014 (JP) .................. 2014-081564

(51) Int. Cl.
*H05K 5/02* (2006.01)
*H01G 2/04* (2006.01)
(Continued)

(52) U.S. Cl.
CPC ............ *H05K 5/0247* (2013.01); *G01K 1/14* (2013.01); *H01G 2/04* (2013.01); *H01G 11/10* (2013.01);
(Continued)

(58) Field of Classification Search
CPC .................................................. H05K 5/0247
(Continued)

(56) References Cited

U.S. PATENT DOCUMENTS

| | | | |
|---|---|---|---|
| 2009/0039836 A1* | 2/2009 | Asada | G01K 1/14 320/152 |
| 2011/0287298 A1* | 11/2011 | Park | H01M 2/1077 429/156 |
| 2014/0140369 A1* | 5/2014 | Erhart | H01M 2/348 374/121 |

FOREIGN PATENT DOCUMENTS

| | | |
|---|---|---|
| JP | 2009-040314 | 2/2009 |
| JP | 2012-154901 | 8/2012 |

(Continued)

OTHER PUBLICATIONS

Search Report issued in International Bureau of WIPO Patent Application No. PCT/JP2015/060348, dated Jun. 9, 2015.

*Primary Examiner* — Hoa C Nguyen
*Assistant Examiner* — Stanley Tso
(74) *Attorney, Agent, or Firm* — Greenblum & Bernstein, P.L.C.

(57) ABSTRACT

A wiring module includes: an insulating protector that has connection member holding portions for holding connection members that electrically connect adjacent electrode termi- (Continued)

nals; and a temperature detection member that detects the temperature of one of the connection members. The temperature detection member has a temperature detection element, electrical wires that are connected to the temperature detection element, an element accommodating portion that accommodates the temperature detection element and from which the electrical wires extend, and a detection portion that is continuous with the element accommodating portion and is arranged to be in contact with the connection member. The insulating protector has a locking portion that locks the element accommodating portion on the outer side of the connection member holding portions.

4 Claims, 3 Drawing Sheets

(51) Int. Cl.
    *H01R 9/26*     (2006.01)
    *H01M 2/20*     (2006.01)
    *H01M 10/48*     (2006.01)
    *H01G 11/10*     (2013.01)
    *H01G 11/18*     (2013.01)
    *H01G 11/76*     (2013.01)
    *H01G 11/82*     (2013.01)
    *G01K 1/14*     (2006.01)

(52) U.S. Cl.
    CPC ............ *H01G 11/18* (2013.01); *H01G 11/76* (2013.01); *H01G 11/82* (2013.01); *H01M 2/202* (2013.01); *H01M 10/486* (2013.01); *H01R 9/2675* (2013.01); *H05K 5/0221* (2013.01); *G01K 2205/00* (2013.01); *Y02E 60/13* (2013.01); *Y02T 10/7022* (2013.01)

(58) Field of Classification Search
    USPC ...................................................... 174/72 R
    See application file for complete search history.

(56) References Cited

FOREIGN PATENT DOCUMENTS

| | | |
|---|---|---|
| JP | 2013-143181 | 7/2013 |
| JP | 2013-161749 | 8/2013 |

\* cited by examiner

WIRING MODULE

TECHNICAL FIELD

The present invention relates to a wiring module.

BACKGROUND ART

In batteries mounted in electric automobiles and hybrid vehicles, many battery cells are connected in series or in parallel in order to increase the output. The lifetime of this type of battery may decrease if it is used in a high temperature environment, and in the case of a battery in which lithium ion cells or the like are connected together, the battery may ignite due to reaching a high temperature during charging. In view of this, in order to avoid such situations, a temperature sensor for detecting the temperature of a power storage element is attached to the battery (e.g., see Patent Document 1).

CITATION LIST

Patent Documents

Patent Document 1: JP 2012-154901A

SUMMARY OF INVENTION

Technical Problem

In the temperature sensor disclosed in Patent Document 1, elastic portions are integrally molded, by insert molding, with a module component that is to be attached to a battery cell group made up of battery cells, and the temperature sensor is attached so as to come into contact with a battery cell by attaching the module component to the battery cell group. With the above configuration, a resin module needs to be produced in accordance with the number of temperature sensors and the attachment positions thereof.

As a means for solving such a problem, consideration has been given to attaching a temperature sensor that is separate from the module component to a battery cell, but this configuration needs a structure for holding the temperature sensor on the module component. When providing a structure for holding the temperature sensor, consideration needs to be given to interference with tools and the like for connecting bus bars and the like.

An object of the present invention is to provide a wiring module that has a structure for holding a temperature detection member while also preventing interference with a tool or the like.

Solution to Problem

In order to solve the above-described issues, one aspect of the present invention is a wiring module for attachment to a power storage element group in which a plurality of power storage elements, each having a positive electrode terminal and a negative electrode terminal, are arranged side-by-side, the wiring module including: an insulating protector having connection member holding portions that hold connection members that electrically connect adjacent electrode terminals; and a temperature detection member that detects the temperature of one of the connection members, wherein the temperature detection member includes a temperature detection element, an electrical wire connected to the temperature detection element, an element accommodating portion that accommodates the temperature detection element, and from which the electrical wire extends, and a detection portion that is continuous with the element accommodating portion and is arranged to be in contact with the connection member, and the insulating protector has a locking portion that locks the element accommodating portion on an outer side of the connection member holding portions.

The connection members that connect adjacent electrode terminals to each other are connected using a tool or the like, and in the present invention, the insulating protector has the locking portion that locks the element accommodating portion of the temperature detection member on the outer side of the connection member holding portion, thus making it unlikely for interference to occur between the locking portion and the tool. Also, in the present invention, the temperature detection member is locked and held in the insulating protector by the locking portion. As a result, according to the present invention, it is possible to provide a wiring module that has a structure for holding the temperature detection member while also preventing interference with a tool or the like.

The present invention may be configured as described below.

The insulating protector may have a detection member holding portion that receives and holds the element accommodating portion on the outer side of the connection member holding portion. According to this configuration, the element accommodating portion is reliably held by the insulating protector.

The temperature detection member may have a recession portion that is formed between the element accommodating portion and the detection portion, and the insulating protector may have a fixing portion that fixes the recession portion.

According to this configuration, the temperature detection member is positioned by the recession portion of the temperature detection member being fixed by the fixing portion of the insulating protector.

Advantageous Effects of Invention

According to the present invention, it is possible to provide a wiring module that has a structure for holding a temperature detection member while also preventing interference with a tool or the like.

DESCRIPTION OF EMBODIMENTS

First Embodiment

A first embodiment of the present invention will be described below with reference to FIGS. 1 to 3. In a wiring module 10 of the present embodiment, adjacent electrode terminals 15 of a line of power storage elements (not shown) are connected to each other by connection members 12. A power storage module M, which is obtained by attaching the wiring module 10 of the present embodiment to the group of power storage elements, is used as a driving source in a vehicle such as an electric automobile or a hybrid automobile. Only some identical members are denoted by reference signs in the figures, and reference signs are sometimes omitted for other identical members.

Power Storage Element

The power storage element group is made up of power storage elements that are arranged side-by-side. The power storage elements (not shown in detail) that constitute the power storage element group each have a main body in which a power storage portion is accommodated, and positive and negative electrode terminals 15 that protrude outward from the main body. The electrode terminals 15 are shaped as holes, and a thread portion (not shown) capable of mating with the thread ridge of a bolt (not shown) for connection with the connection member 12 is formed in each of the electrode terminals 15. The power storage elements are arranged such that adjacent electrode terminals 15 have opposite polarities, and are connected in series.

In the present embodiment, any power storage element such as a secondary cell, a capacitor, or a condenser can be used as the power storage element as necessary. Secondary cells are used as the power storage elements of the present embodiment.

Wiring Module 10

Figure 1:
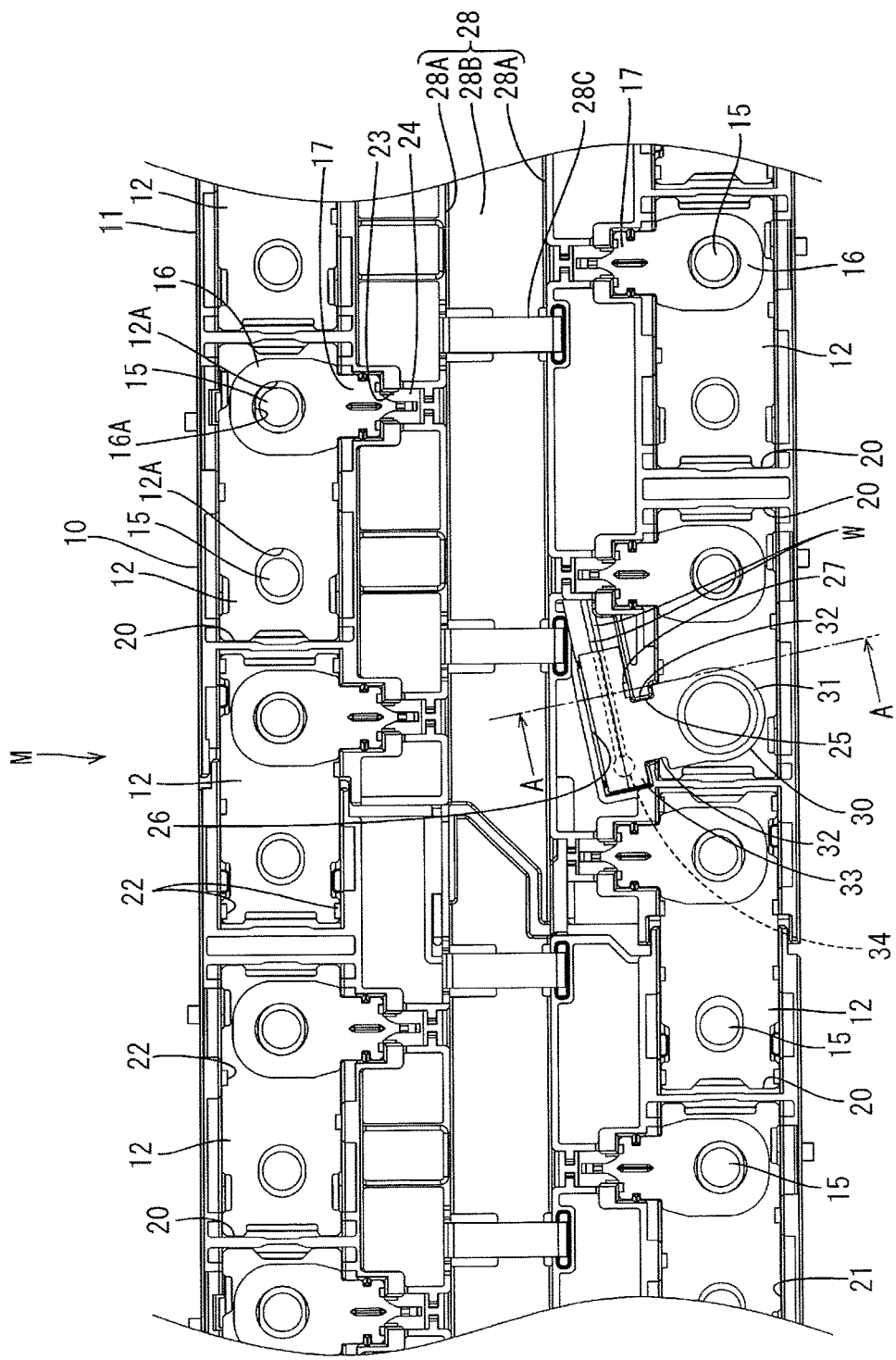
FIG. 1 is a partial plan view of a wiring module according to a first embodiment.

As shown in FIG. 1, the wiring module 10 includes multiple connection members 12 that connect adjacent electrode terminals 15 of power storage elements to each other, an insulating protector 11 that is made of an insulating resin and has connection member holding portions 20 for holding the connection members 12, and a temperature detection member 30 that detects the temperature of a connection member 12.

Connection Member 12

The connection members 12 are each formed by pressing a metal plate material, which is made of copper, a copper alloy, stainless steel (SUS), aluminum, or the like, into a predetermined shape, and have an approximately rectangular shape overall as shown in FIG. 1. The surface of the connection member 12 may be plated with a metal such as tin or nickel. A pair of terminal through-holes 12A, which each have an approximately circular shape and into which bolts for connection to an electrode terminal 15 are inserted, are formed through the connection member 12.

Note that the connection member 12 whose temperature is to be detected and a detection portion 31 of the temperature detection member 30 are sandwiched between the terminal block (not shown) and the head portions of the bolts.

Voltage Detection Terminal 16

A voltage detection terminal 16 is placed on the connection member 12 and connected to one of the electrode terminals 15 by screwing. A circular through-hole 16A into which the electrode terminal 15 is inserted is formed in the voltage detection terminal 16. A detection electrical wire (not shown) is connected to an end portion of the voltage detection terminal 16, and an electrical wire connection portion 17 for connection to the detection electrical wire is held by a terminal holding portion that is provided on the outer side of the connection member holding portion 20. The detection electrical wire extends to an electrical wire accommodating portion 28 through an electrical wire opening 23.

Temperature Detection Member 30

Figure 2:
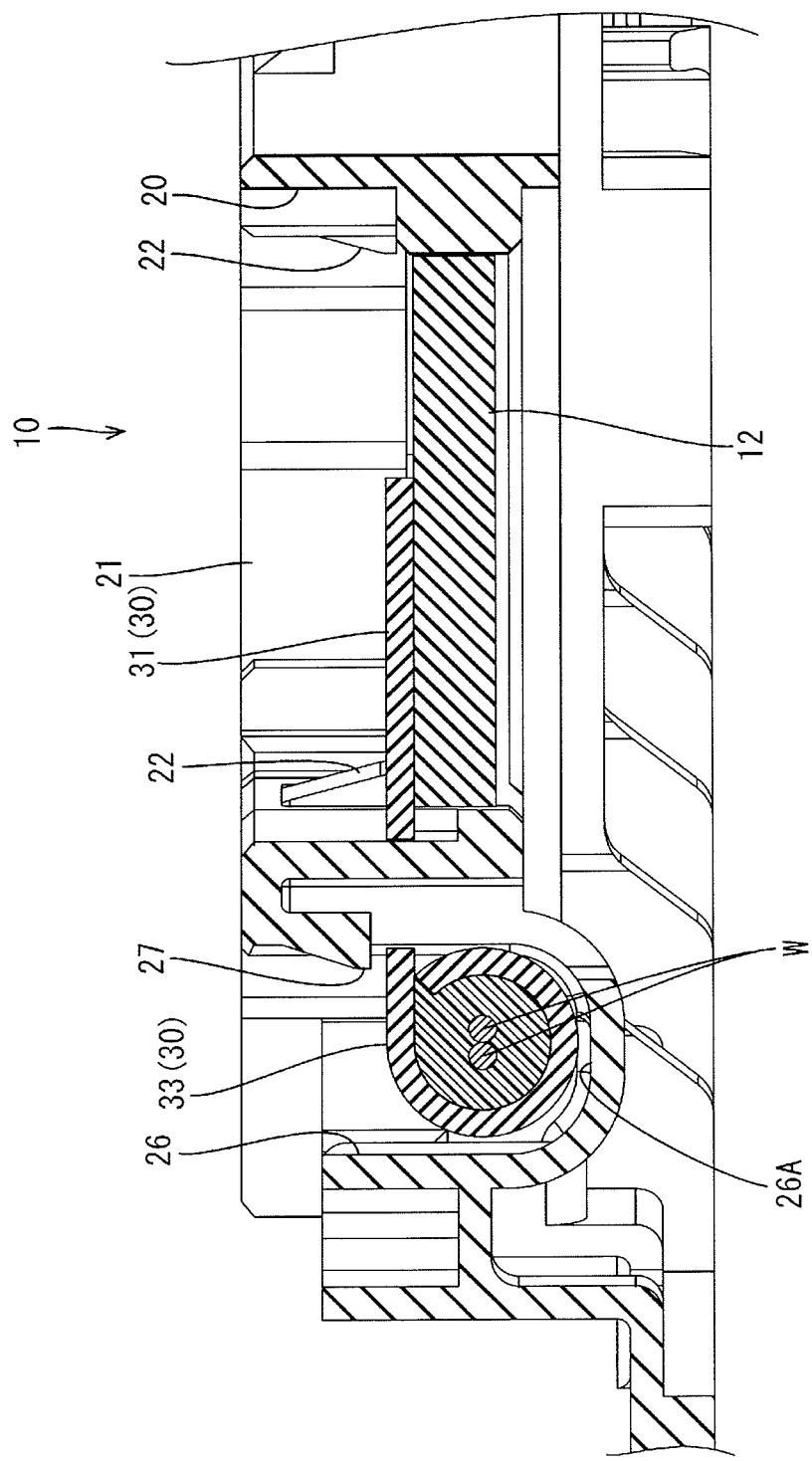
FIG. 2 is a cross-sectional view taken along line A-A in FIG. 1.
Figure 3:
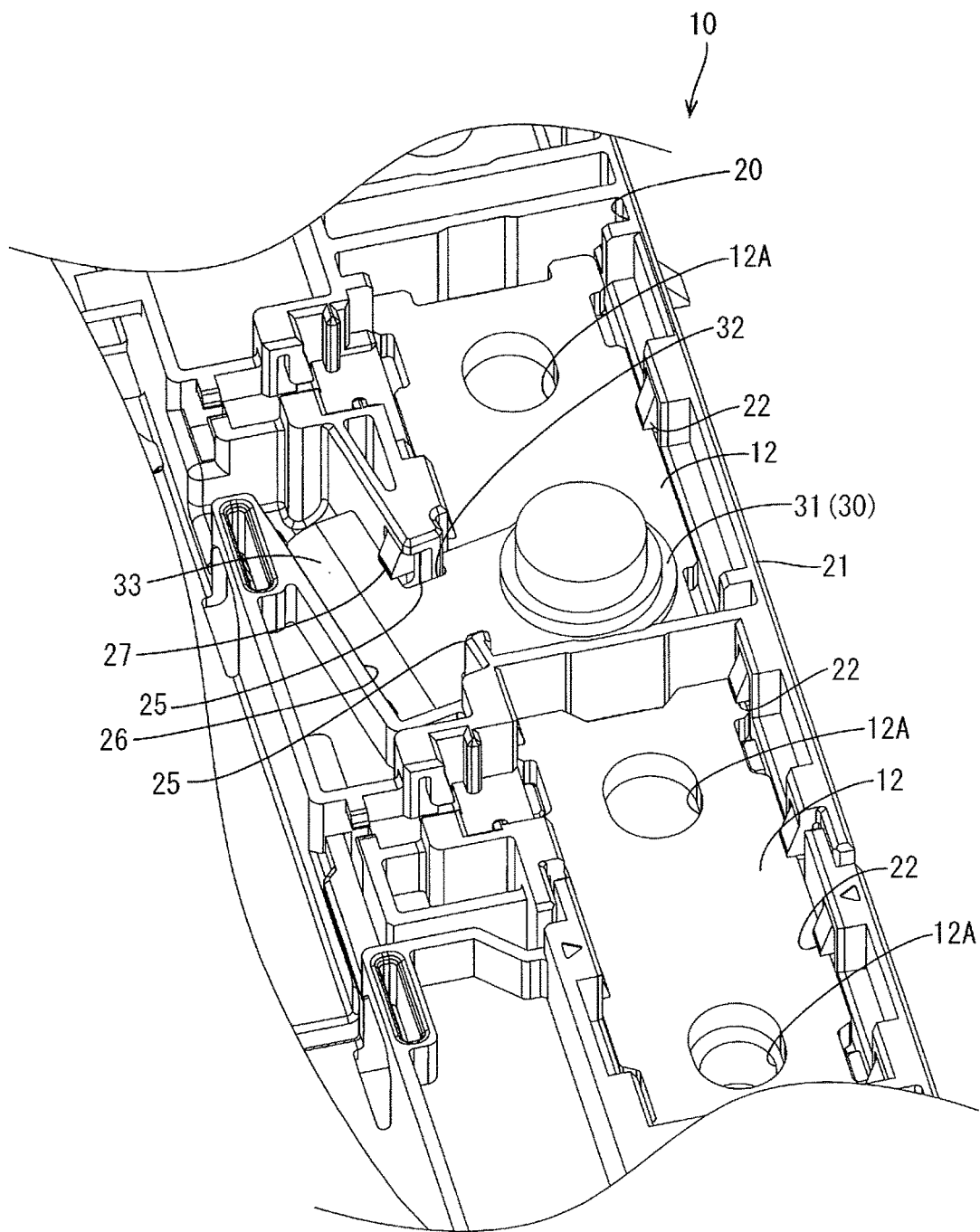
FIG. 3 is a perspective view of a relevant portion of the wiring module.

As shown in FIGS. 1 to 3, the wiring module 10 of the present embodiment includes the temperature detection member 30. The temperature detection member 30 includes the detection portion 31 and an element accommodating portion 33 that accommodates a temperature detection element 34 and in which electrical wires W extend, and the element accommodating portion 33 and the detection portion 31 are integrally connected to each other.

The element accommodating portion 33 of the temperature detection member 30 is held by being fitted into a detection member holding portion 26 that is provided in the insulating protector 11. A recession portion 32, which is formed between the element accommodating portion 33 and the detection portion 31 and is narrower than the detection portion 31, is a portion that is fixed to a fixing portion 25 formed in the insulating protector 11.

The element accommodating portion 33 is provided with a tubular shape by bending a metal plate material that is continuous with the detection portion 31, and the temperature detection element 34, to which the electrical wires W are connected, is accommodated in the element accommodating portion 33. In the present embodiment, as shown in FIG. 1, the element accommodating portion 33 extends in a direction that is oblique to the alignment direction (left-right direction in the figure) of the connection member holding portions 20.

The temperature detection element 34 is constituted by a thermistor, for example. A PTC thermistor or an NTC thermistor can be appropriately selected as the thermistor. Also, the temperature detection element 34 is not limited to being a thermistor, and it is possible to appropriately select any element as long as it can perform temperature detection.

A pair of electrical wires W are connected to the temperature detection element 34 and extend out from the element accommodating portion 33 toward the electrical wire accommodating portion 28. The electrical wires W are connected to an external circuit that is not shown, and signals from the temperature detection element 34 are transmitted to the external circuit via the electrical wires W. The external circuit is arranged on a battery ECU that is not shown, for example, and detects the temperature of the connection member 12 based on a signal from the temperature detection element 34.

The detection portion 31 has a flat plate shape, and a terminal insertion hole (not shown), into which an electrode terminal 15 can be inserted, is formed in an approximately central portion of the detection portion 31. The electrode terminal 15 is inserted into a hole that is formed when the terminal insertion hole of the detection portion 31 and the terminal through-hole 12A of the connection member 12 overlap each other.

The temperature detection member 30 is produced by processing a metal plate member that is made of copper, a copper alloy, stainless steel (SUS), aluminum, or the like. The temperature detection member 30 is produced by a method in which, for example, the tubular element accommodating portion 33 is formed by pressing metal plate member into a predetermined shape and then performing bending processing or the like on it, the temperature detection element 34 that is connected to the electrical wires W is inserted into the element accommodating portion 33, and then an insulating resin (e.g., epoxy resin) is poured into the element accommodating portion 33 and allowed to harden.

Insulating Protector 11

As shown in FIG. 1, the insulating protector 11 is provided with a shape that is long and thin in the left-right direction (alignment direction of the power storage elements). The connection member holding portions 20, which are open upward and each have partition walls 21 that partition a space from the outside and can hold a connection member 12, are provided in the insulating protector 11 in two lines that extend in the lengthwise direction. The electrical wire accommodating portion 28, which accommodates the detection electrical wires and the electrical wires W that are connected to the temperature detection member 30, is provided between the two lines of connection member holding portions 20.

Multiple pressing pieces 22, which prevent the connection member 12 from escaping upward, are formed on the partition walls 21 of each the connection member holding portions 20.

Among the partition walls 21 of the connection member holding portion 20, the partition wall 21 on the electrical wire accommodating portion 28 side has a shape that extends along the outer peripheral shape of the electrical wire connection portion 17 of the voltage detection terminal 16, and is provided with the electrical wire opening 23 for drawing out the detection electrical wire. An electrical wire groove 24, in which the detection electrical wire is arranged, is provided between the electrical wire opening 23 and the electrical wire accommodating portion 28, and the electrical wire groove 24 is continuous with the electrical wire accommodating portion 28.

Among the connection member holding portions 20, the connection member holding portion 20 that is the third from the left in the line on the near side in FIG. 1 has an opening in a portion of one of the partition walls 21 thereof. The opening portion in the partition wall 21 is the fixing portion 25 that receives and fixes the recession portion 32 formed between the element accommodating portion 33 and the detection portion 31 of the temperature detection member 30.

The detection member holding portion 26 that extends along the outer peripheral shape of the element accommodating portion 33 is provided on the outer side of the connection member holding portion 20. As shown in FIG. 2, a bottom wall 26A of the detection member holding portion 26 protrudes downward in conformity with the tubular element accommodating portion 33.

The element accommodating portion 33 of the temperature detection member 30 is fitted into and held by the detection member holding portion 26 provided on the insulating protector 11, and the electrical wires W extending from the element accommodating portion 33 are arranged in the electrical wire accommodating portion 28.

A locking portion 27 that locks the element accommodating portion 33 of the temperature detection member 30 is formed on the detection member holding portion 26 provided on the outer side of the connection member holding portion 20. As shown in FIG. 3, the locking portion 27 is configured to be capable of bending deformation, by providing a C-shaped cutout in the detection member holding portion 26.

The electrical wire accommodating portion 28 includes a pair of side wall portions 28A that extend in the lengthwise direction and a bottom wall portion 28B that connects the pair of side wall portions 28A. The side wall portions 28A are provided with electrical wire pressing portions 28C that prevent the popping up of the electrical wires W arranged in the electrical wire accommodating portion 28.

Wiring Module 10 Assembly Method

When assembling the wiring module 10 of the present embodiment, first the connection members 12 are placed in the connection member holding portions 20 of the insulating protector 11. Next, the voltage detection terminals 16 are placed over and accommodated in the connection members 12, and the detection electrical wires are placed in the electrical wire accommodating portion 28.

Next, the temperature detection member 30 is attached. The temperature detection member 30 is arranged such that the element accommodating portion 33 corresponds to the detection member holding portion 26, and such that the terminal insertion hole of the detection portion 31 overlaps a terminal through-hole 12A of the connection member 12. When the recession portion 32 of the temperature detection member 30 is fitted into the fixing portion 25 of the insulating protector 11, the recession portion 32 is positioned in the fixing portion 25.

The element accommodating portion 33 is then inserted into the detection member holding portion 26, and when the element accommodating portion 33 and the locking portion 27 come into contact, the locking portion 27 undergoes elastic deformation. When the element accommodating portion 33 is accommodated in the connection member holding portion 20, the locking portion 27 undergoes elastic restoration, and thus the element accommodating portion 33 is prevented from coming out of the connection member holding portion 20, and the detection portion 31 is superimposed on the connection member 12. The electrical wires W connected to the temperature detection member 30 are placed in the electrical wire accommodating portion 28. Thus, the wiring module 10 is obtained.

The power storage elements are arranged side-by-side such that adjacent electrode terminals 15 have different polarities, and the wiring module 10 is placed thereon such that the terminal through-holes 12A of the connection members 12 match the positions of the electrode terminals 15.

Next, a tool is used to connect cell connection bolts to the hole-shaped portions of the electrode terminals 15 that have been inserted through the connection members 12 and the voltage detection terminals 16. The locking portion 27 that locks the element accommodating portion 33 at this time is formed on the outer side of the connection member holding portion 20, and therefore interference is not likely to occur between the tool and the locking portion 27. When the connection of all of the bolts ends, the power storage module M is complete.

Actions and Effects of Present Embodiment

In the present embodiment, the connection members 12 that connect adjacent electrode terminals 15 are bolt-fastened using a tool or the like, and the insulating protector 11 has the locking portion 27 that locks the element accommodating portion 33 of the temperature detection member 30 on the outer side of a connection member holding portion 20, thus making it unlikely for interference to occur between the locking portion 27 and the tool. Also, in the present embodiment, the temperature detection member 30 is held in the insulating protector 11 by the locking portion 27. As a result, according to the present embodiment, it is possible to provide a wiring module 10 that has a structure for holding the temperature detection member 30 while also preventing interference with a tool or the like.

Also, according to the present embodiment, the insulating protector 11 has the detection member holding portion 26 that receives and holds the element accommodating portion 33 on the outer side of the connection member holding portion 20, and thus the element accommodating portion 33 is reliably held by the insulating protector 11.

Furthermore, according to the present embodiment, the temperature detection member 30 has the recession portion 32 that is formed between the element accommodating portion 33 and the detection portion 31, and the insulating protector 11 has the fixing portion 25 that fixes the recession portion 32, and thus the temperature detection member 30 is positioned by the recession portion 32 of the temperature detection member 30 being fixed by the fixing portion 25 of the insulting protector 11.

Other Embodiments

The present invention is not limited to the embodiment described above using the foregoing description and drawings, and embodiments such as the following are also encompassed in the technical scope of the present invention.

(1) Although an example in which the element accommodating portion 33 extends in a direction oblique to (a direction that intersects) the alignment direction of the connection member holding portions 20 is described in the above embodiment, the element accommodating portion may extend perpendicular to or parallel with the alignment direction of the connection member holding portions (alignment direction of the power storage elements).

(2) Although the insulating protector 11 that has the detection member holding portion 26 for receiving and holding the element accommodating portion 33 on the outer side of the connection member holding portion 20 is shown in the above embodiment, the detection member holding portion may be omitted from the insulating protector.

(3) The above embodiment describes a configuration in which the temperature detection member 30 has the recession portion 32 that is formed between the element accommodating portion 33 and the detection portion 31, and in which the recession portion 32 is fixed to the insulating protector 11, but the recession portion may be omitted from the temperature detection member. Also, a configuration is possible in which the recession portion is formed in the insulating protector, and a protrusion portion for fixing the recession portion is formed between the element accommodating portion and the detection portion of the temperature detection member.

REFERENCE SIGNS LIST

10 Wiring module
11 Insulating protector
12 Connection member
12A Terminal through-hole
15 Electrode terminal (power storage element)
20 Connection member holding portion
21 Partition wall
25 Fixing portion
26 Detection member holding portion
27 Locking portion
30 Temperature detection member
31 Detection portion
32 Recession portion
33 Element accommodating portion
34 Temperature detection element
W Electrical wire

The invention claimed is:

1. A wiring module for attachment to a power storage element group in which a plurality of power storage elements, each having a positive electrode terminal and a negative electrode terminal, are arranged side-by-side, the wiring module comprising:
    an insulating protector having connection member holding portions configured to hold connection members that electrically connect adjacent electrode terminals; and
    a temperature detection member configured to detect the temperature of one of the connection members,
    wherein the temperature detection member includes
        a temperature detection element,
        an electrical wire connected to the temperature detection element,
        an element accommodating portion configured to accommodate the temperature detection element, and from which the electrical wire extends, and
        a detection portion that is continuous with the element accommodating portion and is configured to be in contact with the connection member, and
    the insulating protector has a locking portion configured to lock the element accommodating portion on an outer side of the connection member holding portions.

2. The wiring module according to claim 1, wherein the insulating protector has a detection member holding portion configured to receive and hold the element accommodating portion on the outer side of the connection member holding portions.

3. The wiring module according to claim 1,
    wherein the temperature detection member has a recession portion between the element accommodating portion and the detection portion, and
    the insulating protector has a fixing portion configured to fix the recession portion.

4. The wiring module according to claim 2,
    wherein the temperature detection member has a recession portion between the element accommodating portion and the detection portion, and
    the insulating protector has a fixing portion configured to fix the recession portion.

* * * * *